United States Patent [19]

Sanchez

[11] Patent Number: 6,028,423

[45] Date of Patent: Feb. 22, 2000

[54] ISOLATION INSTRUMENT FOR ELECTRICAL TESTING

[76] Inventor: Jorge Sanchez, 15655 Oakstand Rd., Poway, Calif. 92064

[21] Appl. No.: 08/988,865

[22] Filed: Dec. 11, 1997

[51] Int. Cl.[7] .......................... G01R 31/302; G01R 31/00
[52] U.S. Cl. .............................................. 324/96; 324/750
[58] Field of Search .............................. 324/96, 529, 530, 324/750, 753

[56] References Cited

U.S. PATENT DOCUMENTS

| | | | |
|---|---|---|---|
| 3,346,811 | 10/1967 | Perry | 324/96 |
| 4,290,146 | 9/1981 | Adolfsson . | |
| 4,290,297 | 9/1981 | Anderson . | |
| 4,677,536 | 6/1987 | Pepper . | |
| 4,734,873 | 3/1988 | Malloy . | |
| 4,758,779 | 7/1988 | Thong . | |
| 4,875,006 | 10/1989 | Henley . | |
| 4,939,446 | 7/1990 | Rogers . | |
| 4,996,478 | 2/1991 | Pope . | |
| 5,021,647 | 6/1991 | Tatsuno . | |
| 5,107,202 | 4/1992 | Renda . | |
| 5,136,237 | 8/1992 | Smith . | |
| 5,164,662 | 11/1992 | Emery . | |
| 5,181,026 | 1/1993 | Granville . | |
| 5,311,116 | 5/1994 | Rogers . | |
| 5,414,345 | 5/1995 | Rogers . | |
| 5,583,444 | 12/1996 | Nakamura et al. | 324/96 |

FOREIGN PATENT DOCUMENTS

| | | |
|---|---|---|
| 295 14 423 U | 12/1995 | Germany . |
| 195 07 809 | 9/1996 | Germany . |

OTHER PUBLICATIONS

Lin, "FCBM–A Field–Induced Charged–Board Model for Electrostatic Discharges," IEE Transactions on Industry Applications, Nov. 1, 1993, pp. 1047–1052, vol. 29, No. 6.

Anderson, et al, "A Conductive Probing Method for Determining Integrated Circuit Contributions to Radiated Emissions," Conference Proceedings RF Expo West, Jan. 29, 1995, pp. 355–362.

Daher, et al, "A Radiated Susceptibility Test Technique for PC Boards Implementing Built–in–Test or Boundary Scan Designs," Symposium on Electromagnetic Compatibility, Aug. 21, 1990, pp. 109–112, Washington, D.C., USA.

Delwaulle, "Problems in Multi–Normative Environments," Revue Generale de L Electricite, et de L Electronique, Nov. 1, 1995, pp. 22–30.

Boucher, "Optic Fibers in a High–Voltage Environment A Potential That Makes All the Difference," Mesures Regulation Automatisme, Oct. 23, 1989, pp. 41–45, No. 612, Paris, France.

*Primary Examiner*—Walter E. Snow
*Attorney, Agent, or Firm*—Presseisen & Reidelbach, P.C.; Charles Reidelbach, Jr.

[57] ABSTRACT

The present invention provides an electro-optical isolation system for coupling an electronic measuring device to a device under test for making accurate measurements of signals within a wide frequency range while the device under test is being subject to high power electrical disturbances. The invention provides an increased rejection of high common mode signals and reduction of undesired self-capacitance by implementing a shielded handheld transmitter unit having an integrated measurement probe. The transmitter unit converts the sensed signal to an optical signal which is transmitted through an optical medium to a receiver unit. Under control of a microprocessor, the level of the output signal from the transmitter unit is modulated by the signal received from the sensing probe. The microprocessor within the transmitter unit automatically controls the level of optical signal emitted by the optical converter, and further calibrates a driver circuit to maintain measurement accuracy. The modulated optical signal emitted by the electro-optical converter is communicated to the receiver unit by an optical fiber medium.

32 Claims, 4 Drawing Sheets

ISOLATION INSTRUMENT FOR ELECTRICAL TESTING

FIELD OF THE INVENTION

The present invention pertains generally to isolation systems for coupling an electronic measuring and display device to a device under test for making satisfactory electrical measurements while the device under test is being subject to high power electrical disturbances such as electromagnetic interference and/or electrostatic discharge. More particularly, the present invention pertains to an electro-optical isolation system which provides accurate measurements of signals within a wide frequency range and implements a handheld design which integrates the transmitter unit with the measurement probe so as to increase the rejection of high common mode signals while reducing unwanted self capacitance.

BACKGROUND OF THE INVENTION

A wide variety of isolation systems have been developed for providing isolation between a test probe and other test equipment to eliminate electrical disturbances that may tend to compromise the accuracy of the test measurement. Some of these known isolation systems optically isolate the sensing probe from the measurement instrumentation by transmitting the input signal to a receiver over a fiber optic medium. It is of course the object of these devices to prevent the passage of any electrical signals from the transmitter unit to the receiver unit unless they are part of the input signal from the device under test sensed by the test probe.

One such example is the "Fiber Optic Isolation System" manufactured by Tektronix, Inc. under the part number A6905S. This device, claimed to be the highest performance isolation system available, has a frequency bandwidth which is limited to 100 megahertz and a maximum working voltage of 850 volts. Consequently, the use of this device for making satisfactory electrical measurements while the device is being subjected to high power electrical disturbances such as high voltage surges or transients, electromagnetic interference, and/or electrostatic discharge, is ineffective.

Although the above device provides an independent battery source for powering the transmitter to avoid a galvanic connection to earth, the separation between the sensing probe and the transmitter unit, as well as the relatively large surface area of the transmitter unit case re-establishes undesired common mode ground loops, increases capacitive loading on the device under test, and increases electromagnetic radiation sensitivity of the measuring equipment, resulting in inaccurate and often unreliable measurements. These undesirable effects, coupled with the lack of necessary shielding makes its use in high power compliance testing prohibitive.

Another device, U.S. Pat. No. 5,181,026 issued to Granville, discloses a measurement system for monitoring various parameters of a high voltage transmission line. The sensed data is converted into modulated light using light emitting diodes, and transmitted to a ground-based receiver over a fiber optic cable. However, the Granville device is intended to be fixedly connected in series with a high voltage power-line, and therefore lacks portability or applicability in benchtop product compliance testing where multiple measurements are taken. Further, although a high voltage measurement is anticipated, the frequency response is fixed at 60 hertz alternating current.

There are prior art devices which utilize the concepts described above but which fall short of making satisfactory electrical measurements while the device is being subjected to high power electrical disturbances. Current methods implement the "trial and error" approach by creating the disturbance and hypothesizing about the resulting effect without any direct observation.

None of the prior art devices teach an isolation system which has a frequency response from DC to 1 gigahertz and which allows observation of signal parameters such as current and voltage in either an analog or digital waveform while the circuit is undergoing high power compliance testing. There are no known devices which have electromagnetic interference immunity to be able to monitor signals with usable accuracy and reliability.

SUMMARY OF THE INVENTION

It is therefore the primary object of the present invention to provide an isolation system for coupling an electronic measuring and/or display device to a device under test for making satisfactory electrical measurements while the device under test is subjected to high power electrical disturbances such as a high voltage surge or transient, electromagnetic interference, and/or electrostatic discharge.

It is also an object of the present invention to provide a wideband isolation system which provides accurate input signal measurements within a wide frequency range of between 0 hertz and 1 gigahertz.

It is another object of the present invention to provide a transmitter unit which is integrated with the sensing probe so as to reduce electromagnetic radiation.

It is yet another object of the present invention to provide an isolation system having a transmitter unit which is packaged with relatively minimal surface area so as to reduce capacitive loading on the device under test.

It is another object of the present invention to provide a highly portable handheld transmitter unit which allows ease of movement between test nodes of the device under test, as well as flexibility in hard to reach areas and test sites which are remote relative to the location of the receiver unit.

It is another object of the present invention to reduce unnecessary troubleshooting associated with product compliance testing, thereby increasing the efficiency and resulting effective use of engineering resources.

It is another object of the present invention to provide multi-layer shielding of the transmitter unit to increase common mode rejection and radiation immunity during testing.

It is another object of the present invention to provide a fiber optic isolation system which minimizes signal loss during transmission of the signal through a fiber optic medium.

It is another object of the present invention to provide an independent and isolated power source for the transmitter unit so as to reduce common mode ground loops.

It is another object of the present invention to incorporate a high speed circuit for self-calibrating the transmitter unit to provide continuous accurate measurements, and to allow interchangeability of electro-optical converter devices having different characteristics.

It is another object of the present invention to provide an isolation system which utilizes a benchtop set-up for equalizing the common ground system of the electronic instrumentation and test devices so as to perform critical high frequency transient measurements.

These and other objects are achieved in accordance with the present invention by providing an isolation system which utilizes a transmitter unit having an integrated sensing probe that is applied to a device under test to receive an electrical signal to be analyzed. The transmitter unit converts the sensed electrical signal to an optical signal which is transmitted through an optical medium to a receiver unit. The receiver unit converts the optical signal back to an electrical signal for use by a measurement, display, or recording instrument. The transmitter and receiver units may be independently self-powered by respective batteries during operation of the system so as to avoid electrical ground loops present in the device under test and other circuitry in the isolation system.

The transmitter unit input circuitry includes over-voltage protection, selectable voltage ranges, and selectable input impedances. Under control of a microprocessor, the level of the output signal from the transmitter unit is modulated by the signal received from the sensing probe. A wideband frequency response of between 0 hertz and 1 gigahertz is provided by the use of an amplifier circuit. The microprocessor within the transmitter unit automatically and periodically samples the level of optical signal emitted by the optical converter within the transmitter unit, and further calibrates the driver circuit to maintain measurement accuracy.

The modulated optical signal emitted by the electro-optical converter of the transmitter unit is communicated to the receiver unit by an optical fiber. The receiver contains a device for converting the received optical energy back into electrical energy. This electrical signal is then amplified and sent to the external test measurement equipment.

Further detail regarding the isolation system in accordance with the present invention may be had with reference to the detailed description which is provided below, taken in conjunction with the following illustrations.

DETAILED DESCRIPTION OF THE PREFERRED EMBODIMENT

Figure 1:
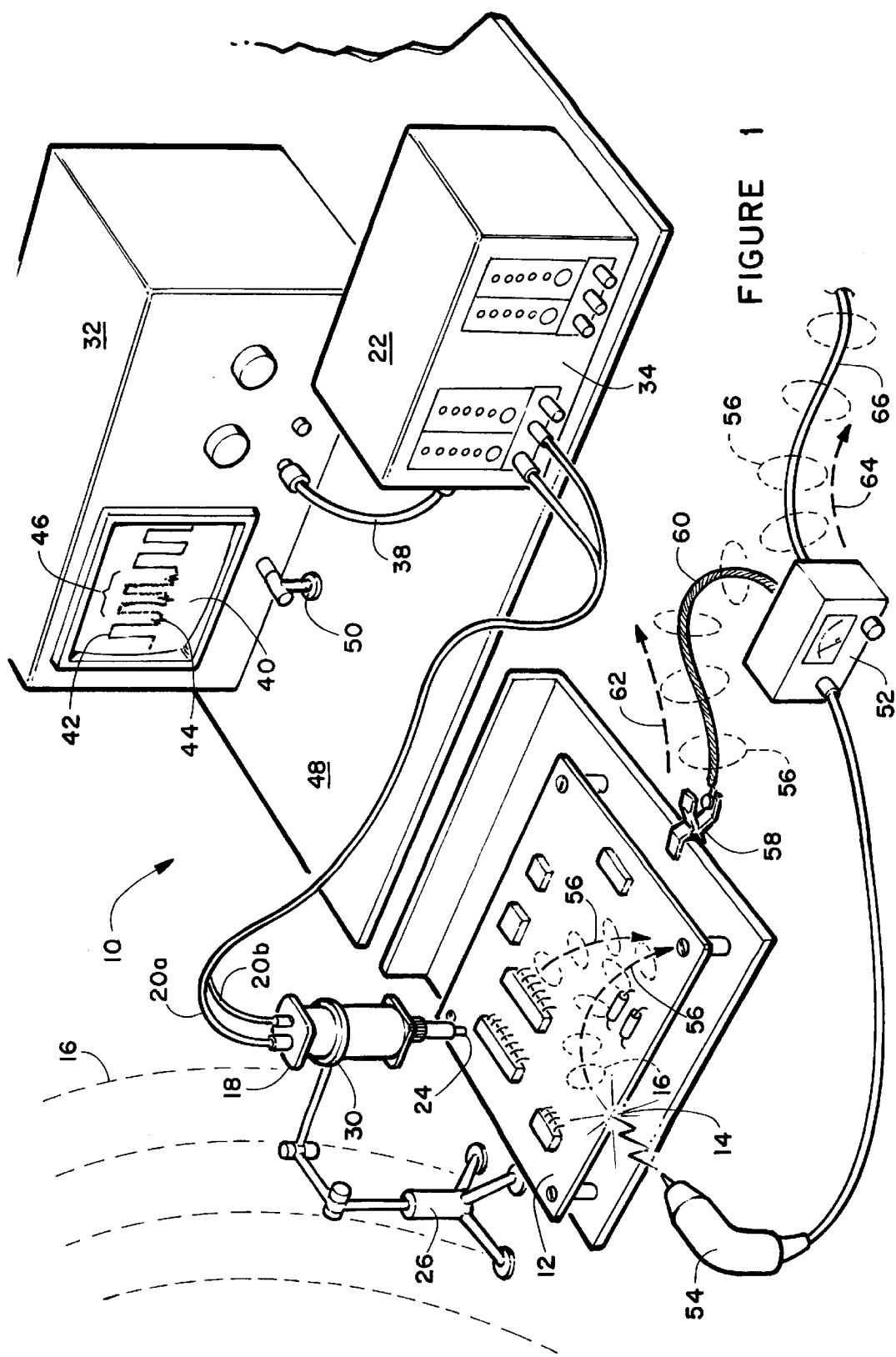
FIG. 1 is an overall perspective view of the present invention in a typical test environment.

Initially referring to FIG. 1, an isolation test system 10 of the present invention is illustrated in a typical test environment. As shown, the isolation test system 10 is set-up to perform accurate signal measurements of a device under test 12 while it is subjected to a wide range of electrical disturbances either naturally present in the test environment or self-produced as a result of the test at hand, including but not limited to, electrostatic discharge 14 and electromagnetic radiation 16.

The isolation test system 10 utilizes a transmitter unit 18 for receiving an electrical signal from the device under test 12 and converting the electrical signal to an optical signal for further transmission to a receiver unit 22. In the preferred embodiment, the transmission medium is a fiber optic cable 20a, chosen from a wide variety of types and characteristics. For instance, the fiber optic cable 20a may be relatively short for workstation or bench-top applications, or may be relatively long for remote off-site applications.

Depending on the particular test application, the fiber optic cable 20a may be single mode and may range in length in excess of one mile. The use of a single mode fiber has the distinct advantage of minimizing signal losses which may occur as a result of vibration during product compliance testing. More specifically, the optical waveguide of a single mode fiber accepts only the center beam as a transmission path and thus avoids paths located at the edge of the fiber. Consequently, when the fiber optic cable is bent or moves as a result of testing, signal losses are minimized.

The transmitter unit 18 contains an integrated sensing probe 24 which may be positioned with respect to the device under test 12 by using an adjustable transmitter stand 26. This allows inherent self-capacitance to be reduced while insuring repeatability of test measurements. The transmitter 18 may be secured to the stand 26 using a stand connector 30.

The receiver unit 22 may have multiple channel capability, each channel communicating with the transmitter unit 18 through the use of two separate fiber optic cables 20a,b. As above mentioned, one fiber optic cable 20a transports the optical signal to the receiver unit 22 for further transmission to an electronic measuring device 32. The other fiber optic cable 20b is preferably multi-directional and provides control data information to and from the transmitter 18.

The receiver unit 22 is designed with a control panel 34 which allows the test engineer to adjust or control various transmitter 18 parameters from a remote location while also reading critical information about the circuit behavior which may be otherwise unavailable.

Each channel of the receiver unit 22 communicates with the electronic measuring device 32 through a shielded cable 38. For illustrative purposes only, the display 40 of the electronic measuring device 32 shows a digital signal measurement 42 of the device under test 12 both before, during and after the disturbance occurred at a particular point in time 44. As shown, the display 40 shows that the disturbance caused a set of noise spikes which in turn made the device under test 12 produce two abnormal square wave pulses 46. In the preferred embodiment, the electronic measuring device 32 is tied to earth ground by securing the device 32 to a sheet metal plate 48 through a conductive bracket 50.

In the preferred embodiment of the present invention, both the transmitter unit 18 and the receiver unit 22 have separate and independent power sources for reducing common mode ground loops. The source of power may be any well known battery device, or an isolated power module which transports power to a remote location through an isolated fiber optic cable. One well known device is a gallium arsenide photovoltaic converter manufactured by Photonic Power Systems, Inc.

The following is only one application of the present invention in a typical test environment and is not intended to limit the scope of the present invention. During compliance testing of a device under test 12, an electrostatic tester 52 or similar device is used to produce and electrostatic discharge 14 between the electrostatic tester probe 54 and the device under test 12. Upon the occurrence of the discharge 14, electrostatic currents 56 flow across the device under test 12 thereby causing malfunctions in circuit performance. The purpose of the present invention is to accurately read this circuit behavior without interference.

These electrostatic currents 56 flow through the device under test 12 and into the printed circuit card assembly mounting screws and standoffs to find a path back to ground. Consequently, ground return currents 62 are created as the current flows through the alligator clamp 58, and further through the braided cable 60 and back to the electrostatic tester 52. In doing so, some of the ground return current 62 leaks into the power line causing a leakage current 64 through the electrostatic tester power cord 66. This flow of current, defined as electrostatic current 56, ground return current 62, and leakage current 64, causes electromagnetic radiation 56 which permeates the test environment as shown by the concentric spheres which radiate from the current paths.

Another application of the present invention is for use in compliance testing of powerline interference. During these tests, powerline disturbances and spikes of high voltage and fast rise times are applied to the input power source of the device under test 12. This in turn causes disturbances and currents in the circuit similar to the case of the above mentioned electrostatic discharge test. The isolator 10 can be used to test the circuit behavior while disturbances are being applied.

Figure 2:
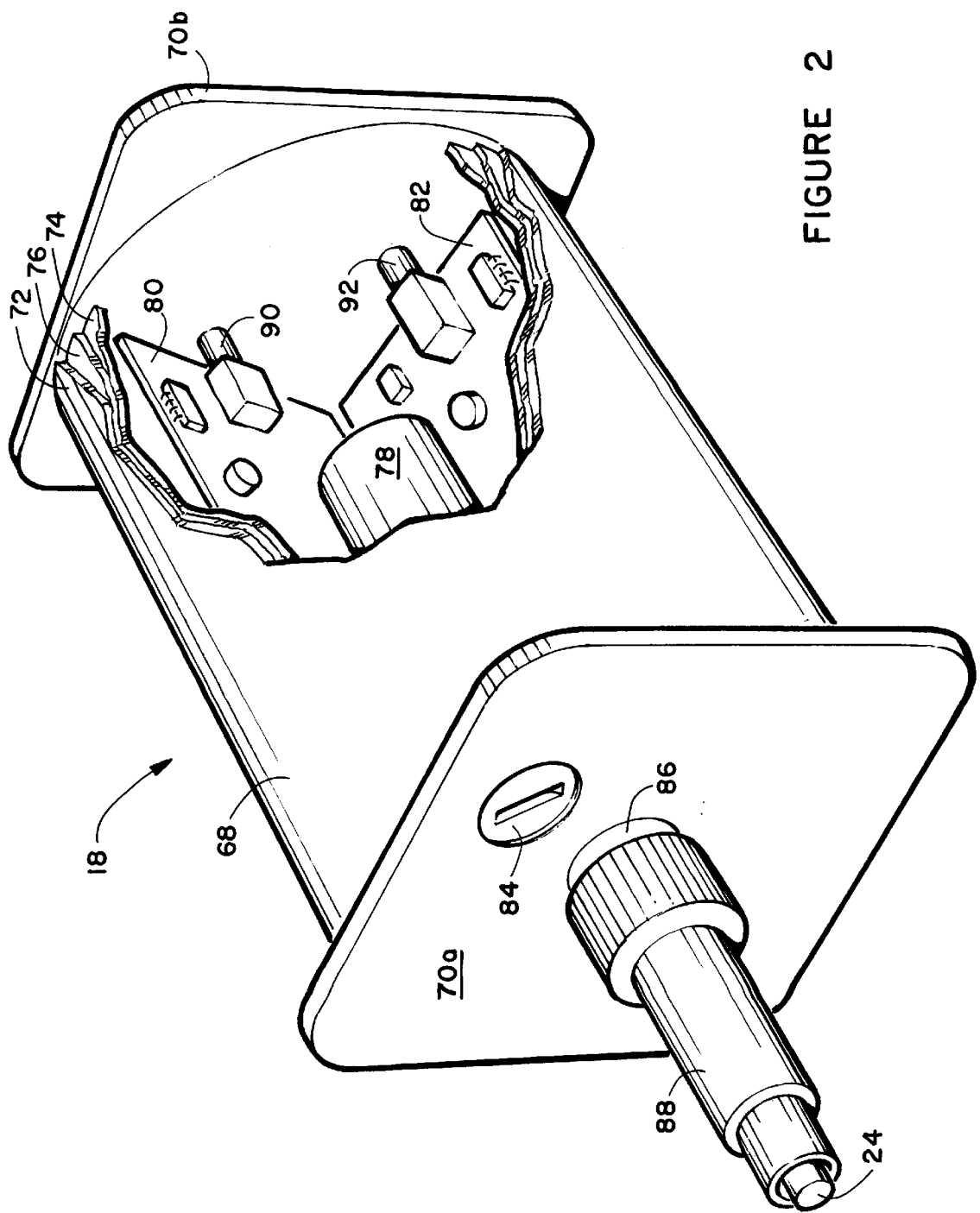
FIG. 2 is a perspective view of the transmitter unit of the present invention with a portion of its shielding cut-away for illustration purposes.

Referring to the illustration in FIG. 2, the transmitter unit 18 of the present invention is a cylindrical body 68 having two end plates 70a,b. The dimensions of the cylindrical body 68 may vary and is preferably less than six inches in length and 2 inches in diameter. The smaller the equivalent surface area of the cylindrical body 68 and end plates 70a,b, the less amount of self-capacitance is created between the transmitter unit 18 and the device under test 12.

As shown, the surrounding walls of the cylindrical body 68 includes an outer layer 72 of nickel plated steel having a relative thickness of ⅛ inch, and an inner layer 74 of copper having a relative thickness of 20 mils. A middle layer 76 of mylar insulation having a relative thickness of 10 mils is located between the outer layer and inner layer. It is to be understood that the above description is only one embodiment of multi-layer shielding, and shielding of a variety of thicknesses and materials may be used to accomplish the intent of the present invention.

The transmitter unit 18 contains an internal cylindrical battery source housing 78 for powering the internally mounted printed circuit card assemblies 80, 82. A plug 84 is shown to provide access to the battery housing 78.

The printed circuit card assemblies 80, 82 are mounted in such a way that the shortest distance between each respective assembly and the inner layer 74 is substantially equal. Consequently, the capacitance at any given point on the assembly is balanced. For example, as a common mode voltage source discharges on the cylindrical body 68, currents flow from one end to the other since the sensing probe 24 may be connected to ground. As the currents flow, they generate voltages on the case which can couple into the circuit card assemblies 80, 82 since they are not completely attenuated by the shielding. At any given point on the assemblies 80, 82, the capacitances and coupled voltages will be equal resulting in no current generation inside the circuits.

An electrical connector 86 is mounted to the front end plate 70a and is connectable to the amplifier assembly 80. The connector 86 may be any device well known in the art, such as a right angle bulkhead jack receptacle. A probe tip 24 having a retracting double shield 88 attaches to the connector 86 to minimize radiation coupling into transmitter unit 18. The probe tip 24 may be any device which is capable of sensing a circuit parameter such as temperature, current, voltage, magnetic field, etc.

The controller assembly 80 contains an optical transceiver module 90 which extends through the back end plate 70b. The module 90 may be any device well known in the art, such as a light emitting or laser diode, which allows digital information, including power, to be communicated between the transmitter unit 18 and the receiver unit 22.

The amplifier assembly 82 contains an electro-optical module 92 which extends through the back end plate 70b. In the preferred embodiment, the electro-optical module 92 is a laser diode and photodiode having a part number GCA-337 and manufactured by GCA Fiberoptics Ltd., although any number of laser modules or electro-optical modules known in the art would fall within the scope of the present invention. The module 92 may be used to transfer information in analog or digital form to the optical fiber 20a.

Figure 3:
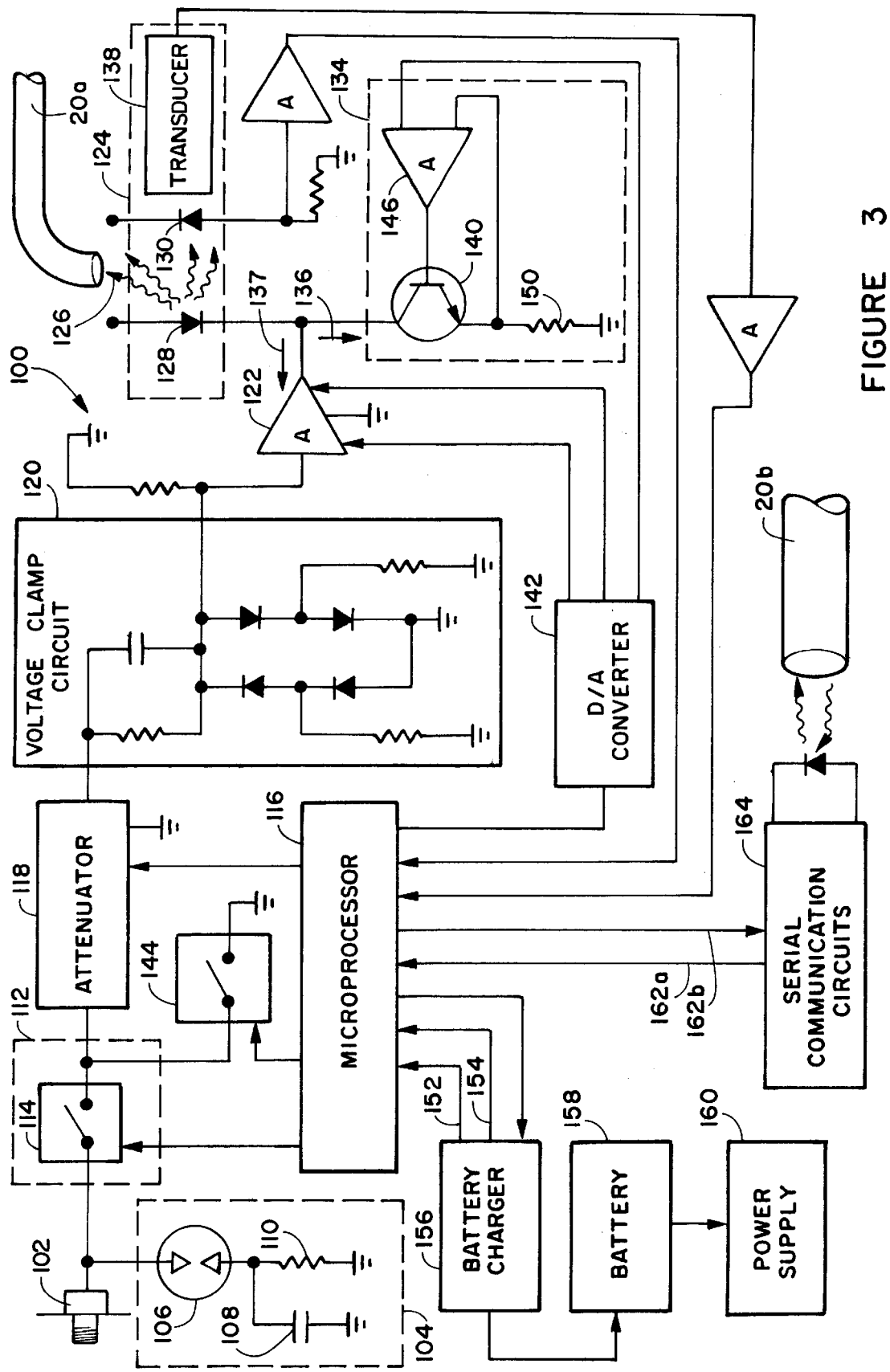
FIG. 3 is a circuit block diagram of the transmitter unit circuitry.

FIG. 3 is a circuit block diagram of the transmitter circuit 100 for providing satisfactory signal measurements over a large range of input signal frequencies. The transmitter circuit 100 includes a input sensor 102 adapted to receive an electrical input signal at a selected point on a device under test 12.

A first level over-voltage protection circuit 104 is coupled to the input sensor 102 and is adapted to shunt any input signals over a predetermined voltage level and having a predetermined duration so that they do not proceed through the transmitter circuit 100. The over-voltage circuit 104 includes an electron tube 106 which becomes shorted with a short duration over-voltage or surge such as electrostatic discharge or power-line transients. A parallel capacitor 108 and resister 110 are connected between the electron tube 106 and circuit common to ensure protection operates for a selected period of time.

A second level over-voltage protection circuit 112 consists of a switching device 114, such as a relay, which operates as a longer duration protection circuit. The switching device 114 is activated or opened when an over-voltage condition is detected by a microprocessor 116.

If the switching device 114 is closed or inactivated, the input signal is coupled to an attenuator circuit 118 which receives the signal and reduces the magnitude of the electrical parameter of said signal by a predetermined amount. The range of the attenuator circuit 118 may also be controlled by the microprocessor 116.

A third level over-voltage protection circuit 120 is coupled between the output of the attenuator circuit 118 and the input of the wideband amplifier circuit 122. The circuit 120 provides a medium level and duration of over-voltage protection by clamping the voltage at the node connected to the input of the amplifier circuit 122.

The amplifier circuit 122 is designed to amplify the attenuated signal occurring in a frequency bandwidth of between 0 hertz and 1 gigahertz. The amplifier circuit 122 may be indirectly controlled by the microprocessor 116 by providing an automatic analog offset adjust and gain adjust.

An electrical-to-optical module 124 having its optical output 126 modulated by the amplifier circuit 122 converts the amplified signal to a modulated optical signal. In the preferred embodiment, the converter module 124 includes both a laser diode 128 and a monitoring photodiode 130. The laser diode 128 provides an optical signal to both the monitoring photodiode 130 and the optical fiber 20a. It is to be noted that a variety of converter module devices, such as an light emitted diode, could be used within the scope of the present invention.

A drive control system automatically controls the level of the optical signal output 126 by the electrical-to-optical module 124 to a predetermined level. The drive control system comprises a driver 134 for maintaining a stable direct current signal 136 through the converter module 124, and the laser diode 128 in the case of the preferred embodiment. Amplifier 122 is used for receiving a useful analog signal and for generating a signal current 137.

A transducer device 138 for measuring a characteristic of the converter 124 is used for converting the characteristic to a useful electrical signal. In the preferred embodiment, the transducer device 138 is a temperature sensor that is thermally connected to the laser module 124 and provides information to the microprocessor 116 on laser diode 128 temperature.

The monitoring photodiode 130, which is built into the laser module 124, provides analog information on the amount of light power out of the laser diode 128. This information is analyzed by the programmable processor 116 and provides a digital output signal which is a function of one or more converter characteristics. For example, if an over-voltage is detected by the microprocessor 116, a signal is sent to the second level over-voltage protection circuit 112 to activate the switching device 114 thereby isolating the input over-voltage signal.

A digital to analog converter 142 for converting the digital output signal from the microprocessor 116 to an analog signal for further use by the driver 134 is implemented to provide a desired stable direct current signal 136. In the preferred embodiment, driver 134 comprises an amplifier 146, transistor 140, and resistor 150.

Inaccuracies present in the optical and electronic system can be calibrated out by a combination of auto-calibration and factory calibration which senses the ideal output from a reference signal. The reference signal originates from the circuit common by closing switch 144 or from an external reference connected to input sensor 102. These signals in turn drive the attenuator circuits 118 and the amplifier 122. This in turn creates laser 128 output light and in turn creates a photodiode 130 current which is proportional to the input reference signal. The photodiode 130 current is processed by microprocessor 116 to re-calibrate the laser diode 128. The microprocessor 116 adjusts the digital to analog converter 142 to zero out offset and gain errors. Furthermore, the driver 134 itself is calibrated by algorithms in the internal processor 116 which senses the temperature of the ambient and corrects the driver 134 for different temperatures.

The microprocessor 116 also has the capability of sensing the charging current 152 and charging voltage 154, and using this information to control the battery charger 156. The battery charger 156 charges the battery 158 to supply power 160 to the transmitter unit 18.

The microprocessor 116 also provides bi-directional 162a,b communication with the receiver unit 22 by means of a bi-directional module 164 which is coupled to a multi-mode fiber optic cable 20b.

Figure 4:
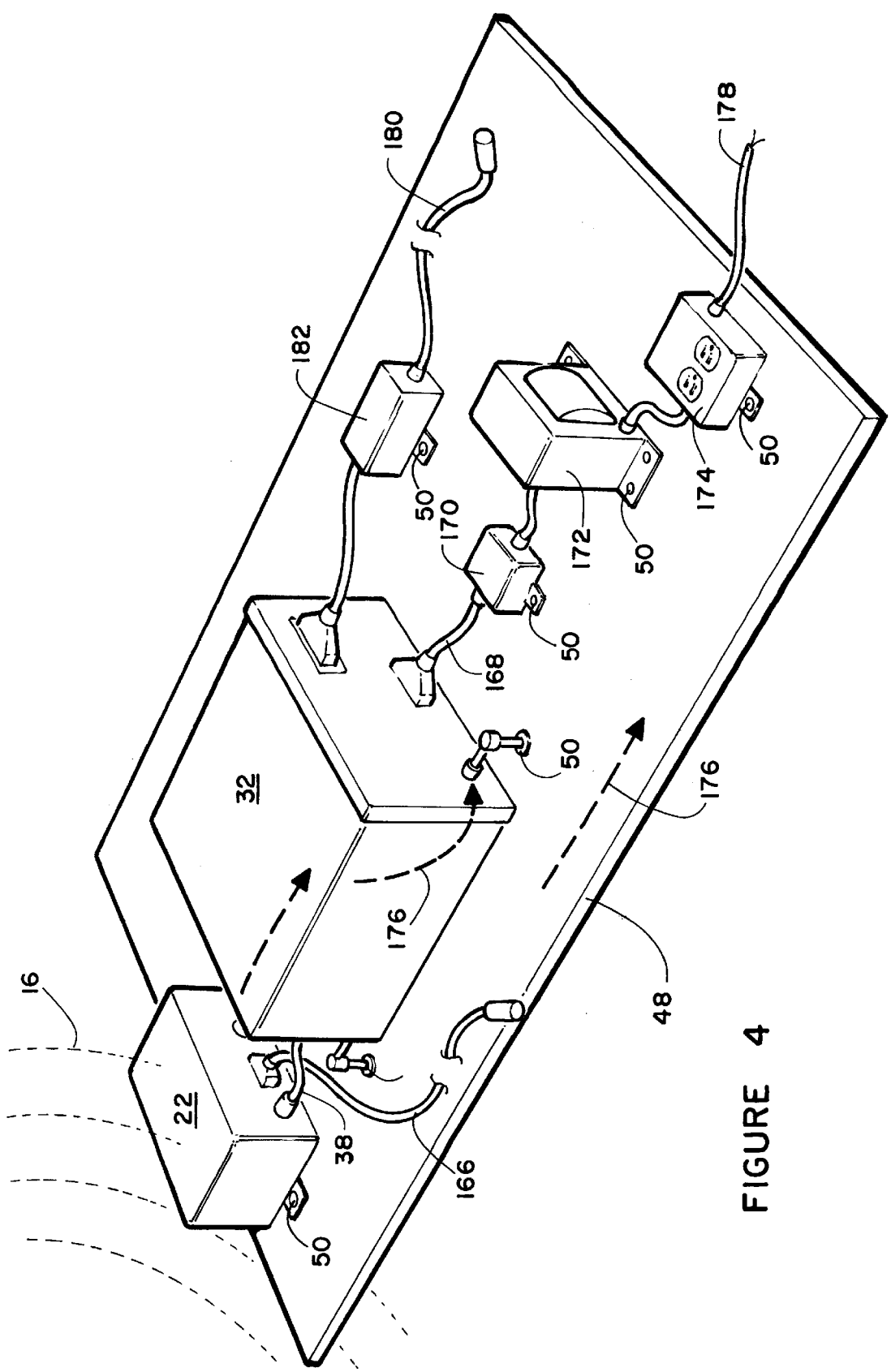
FIG. 4 is a perspective view of the instrumentation and equipment of the receiver system in a workstation set-up to illustrate the flow of interfering currents when exposed to an electromagnetic disturbance, as well as to illustrate a proper set-up for equalizing the earth ground system to perform critical high frequency transient measurements.

As illustrated in FIG. 4, the receiver unit 22 is shown mounted to a earth ground plate 48. As above mentioned, the optical signal is converted to an electrical signal for further transmission to an electronic measurement device 32 through a shielded cable 38. A remote host computer (not shown) may be used to control the isolation system 10 and electronic measurement device 32 through digital communication transmitted by respective fiber optic cables 166 and 180. A bi-directional electrical to optical and optical to electrical input/output unit 182 can be designed either internally or externally as desired.

Each channel of the receiver unit 22 communicates with the electronic measurement device 32 through a shielded cable 38. As illustrated, electronic measurement device 32 has a power cord 168 which is coupled to a line filter 170 and an isolation transformer 172 prior to receiving its power from a wiring box 174. The electronic measurement device 32, line filter 170, isolation transformer 172, and wiring box 174 are fixedly fastened to the ground plate 48 respectively by ground brackets 50.

During testing, electromagnetic radiation 16 surrounds the testing environment, particularly when the receiver unit 22 is located within close proximity to the device under test 12. Consequently, the electromagnetic radiation permeates the entire receiver system resulting in electromagnetic interference currents 176 flowing through the case of the electronic measuring device 32 and to the ground plate 48 through ground brackets 50. Accordingly, current flow into the internal circuitry of the device 32 is minimized, allowing a higher level of immunity to radiation. Currents 176 continue to flow across the ground plate 48 and towards the wiring box 174 power cord 178.

The isolation transformer 172 and line filter 170 increase the impedance of the receiver system to earth ground, which in turn, decreases the amount of radiation current 176. The reduction in radiation current 176 minimizes the overall interference of the receiver system because less current flows into the receiver unit and electronic measurement device. Also, less current flow causes less magnetic fields as the current flows.

If desired, a complete faraday cage (not shown) can be placed around the receiver system for stronger incoming fields. As such, a host computer (not shown) may be used to control and retrieve data from the receiver unit and the measurement and display device.

It will therefore be understood that various changes in the details, materials and arrangement of parts which have been herein described and illustrated in order to explain the nature of the invention may be made by those skilled in the art within the principal and scope of the invention as expressed in the following claims.

I claim:

1. An isolation test probe for providing satisfactory signal measurements over a wide range of input signal frequencies, said probe comprising:

a sensor adapted to communicate with a selected point on a device under test and receive an input signal at said selected point;

an attenuator connected to said sensor to receive said input signal and reduce the magnitude of a parameter of said signal by a predetermined amount;

an amplifier connected to said attenuator to amplify said attenuated signal occurring in a frequency range of between 0 hertz and 1 gigahertz;

an electro-optical converter having its optical output modulated by said amplifier which converts said amplified signal to a modulated optical signal; and a drive controller that automatically controls the level of said optical signal output by said electro-optical converter to a predetermined level.

2. A test probe as recited in claim 1, further comprising an input protection circuit coupled to said sensor and adapted to shunt any input signals over a predetermined level to a common ground.

3. A test probe as recited in claim 1, wherein said drive controller comprises:
   a driver for receiving a control signal and maintaining a stable direct current through said electro-optical converter;
   a transducer device for measuring a non-electrical performance characteristic of said converter and converting said performance characteristic to an electrical signal;
   a processor for receiving said converted electrical signal and providing a digital output signal which is a function of said converter performance characteristic;
   a digital to analog device for converting said digital signal to said control signal for use by said driver; and
   an input protection circuit operable with said processor for isolating said input signal from said attenuator when an overvoltage signal is detected.

4. A test probe as recited in claim 3, wherein said input protection circuit comprises an electrical switching device which is activated by said processor.

5. A test probe as recited in claim 1, further comprising a power source, wherein said power source is a battery.

6. A test probe as recited in claim 3, wherein said electro-optical converter is a laser diode.

7. A test probe as recited in claim 3, wherein said transducer is a temperature sensor.

8. An electronic instrumentation isolation system for performing satisfactory signal measurements of a device under test in a workstation environment, said isolation system comprising:
   a shielded transmitter for receiving an electrical signal from said device and converting said signal to an optical signal;
   an optical fiber transmission system connected to said transmitter to receive said optical signal and conduct it to a receiving end;
   a receiver comprising an optical-to-electrical converter for receiving said conducted signal from said receiving end of said optical fiber and converting said optical signal to an electrical signal;
   an electronic measuring device for receiving and measuring said electrical signal;
   a line filter connected in series with the output of said electronic measuring device;
   an isolation transformer connected in series with the output of said line filter for powering said electronic measuring device; and
   a metal plate connected to said receiver, said electronic measuring device, said line filter, and said transformer for providing an equalized earth ground system.

9. An isolation system as recited in claim 8, further comprising a mounting device for repeatably positioning said transmitter proximate said device under test.

10. An isolation system as recited in claim 8, wherein said fiber optic cable is a single mode optical fiber.

11. An isolation system as recited in claim 8, wherein each of said transmitter and said receiver has a separate and independent battery power source.

12. An isolation system as recited in claim 8, further comprising an optical fiber transmission system connected between said transmitter and said receiver for communicating control data.

13. An isolation system as recited in claim 8, wherein said receiver has a plurality of channels.

14. An instrument for coupling an electronic measuring device to a device under test, said instrument comprising:
   a transmitter having capability for measuring an input signal from said device under test and converting said input signal to an optical signal, said transmitter having an input protection circuit means for managing any said input signals having a predetermined characteristic, and said transmitter having an isolating means for preventing undesirable measurement distortions in said measured input signal caused by high power electrical disturbances which may be present in the test environment of said device under test;
   an optical fiber transmission system connected to said transmitter to receive said optical signal and conduct it to a receiving end; and
   a receiver comprising an optical-to-electrical converter for receiving said conducted signal from said receiving end of said optical fiber and converting said optical signal to an electrical signal for transmission to said electrical measuring device, said receiver having an isolating means for preventing undesirable measurement distortions in said electrical signal caused by high power electrical disturbances which may be present in the test environment of said receiver.

15. An instrument as recited in claim 14, wherein said predetermined characteristic of said input signal is a predetermined voltage having a predetermined time duration.

16. An instrument as recited in claim 15, wherein said input protection circuit means comprises a first level input protection circuit adapted to shunt any said input signals over a first predetermined voltage and having a first time duration, and a second level input protection circuit adapted to decouple any said input signals over a second predetermined voltage and having a second time duration.

17. An instrument as recited in claim 16, wherein said second time duration is greater than said first time duration.

18. An instrument as recited in claim 16, wherein said input protection circuit means further comprises a third level input protection circuit adapted to clamp any said input signals over a third predetermined voltage and having a third time duration to a predetermined level.

19. An instrument as recited in claim 14, wherein said transmitter isolation means comprises an independent power source which is isolated from earth ground.

20. An instrument as recited in claim 14, wherein said transmitter isolation means comprises a shield surrounding said transmitter.

21. An instrument as recited in claim 20, wherein said shield comprises an inner shield and an outer shield.

22. An instrument as recited in claim 21, wherein said outer shield has an effective surface area less than five square inches so as to minimize the undesirable effects of self-capacitance between said transmitter and said device under test.

23. An instrument as recited in claim 14, wherein said transmitter further comprises an amplifier circuit for measuring said input signals having a voltage in the microvolt range.

24. An instrument as recited in claim 14, wherein said optical fiber transmission system is a single mode optical fiber.

25. An instrument as recited in claim 14, wherein said receiver isolation means comprises an independent power source which is isolated from earth ground.

26. An instrument as recited in claim 25, wherein said receiver isolation means further comprises a shield surrounding said receiver.

27. An instrument as recited in claim 14, wherein said transmitter is capable of measuring an input signal by making direct physical contact with said device under test.

28. An instrument as recited in claim 27, wherein said transmitter is further capable of measuring an input signal by non-direct contact with said device under test.

29. An instrument as recited in claim 14, wherein said high power electrical disturbance may comprise any from the group of electromagnetic radiation, electrostatic discharge, and high voltage transients.

30. An instrument as recited in claim 14, wherein said transmitter is capable of measuring an input signal characterized by direct current.

31. An instrument as recited in claim 14, wherein said transmitter has the capability of measuring an input signal between the frequency range of 0 Hertz and 1 Gigahertz.

32. An instrument as recited in claim 20, wherein said transmitter comprises a plurality of circuit card assemblies, said assemblies mounted within said shield such that the average distance between any point on the surface of said shield and said circuit card assembly is substantially equal.

* * * * *

UNITED STATES PATENT AND TRADEMARK OFFICE
CERTIFICATE OF CORRECTION

PATENT NO. : 6,028,423
DATED : February 22, 2000
INVENTOR(S) : Jorge Sanchez

It is certified that error appears in the above-identified patent and that said Letters Patent is hereby corrected as shown below:

Claim 8, column 9,
Lines 44 and 47, change "output" to -- input --.

Signed and Sealed this

Ninth Day of October, 2001

*Attest:*

*Nicholas P. Godici*

NICHOLAS P. GODICI
*Attesting Officer*   *Acting Director of the United States Patent and Trademark Office*